United States Patent
Jeong et al.

(10) Patent No.: US 9,478,267 B1
(45) Date of Patent: Oct. 25, 2016

(54) SEMICONDUCTOR MEMORY APPARATUS, AND IMPEDANCE CALIBRATION CIRCUIT AND METHOD THEREOF

(71) Applicant: SK hynix Inc., Icheon-si Gyeonggi-do (KR)

(72) Inventors: Yo Han Jeong, Icheon-si (KR); Kwan Su Shon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/814,818

(22) Filed: Jul. 31, 2015

(30) Foreign Application Priority Data

May 26, 2015 (KR) .......................... 10-2015-0072694

(51) Int. Cl.
*G11C 7/00* (2006.01)
*G11C 7/12* (2006.01)

(52) U.S. Cl.
CPC ...................... *G11C 7/12* (2013.01)

(58) Field of Classification Search
USPC ............ 365/198, 189.06, 189.05; 326/30, 82
See application file for complete search history.

(56) References Cited

U.S. PATENT DOCUMENTS

| 2010/0308861 A1* | 12/2010 | Lee ..................... H04L 25/0278 326/30 |
| 2011/0128038 A1* | 6/2011 | Ko ............................ G11C 7/02 326/30 |
| 2016/0118984 A1* | 4/2016 | Chern ................ H03K 19/0005 365/189.02 |

FOREIGN PATENT DOCUMENTS

| KR | 1020090121470 A | 11/2009 |
| KR | 1020130093231 A | 8/2013 |

* cited by examiner

*Primary Examiner* — Vu Le
(74) *Attorney, Agent, or Firm* — William Park & Associates Ltd.

(57) ABSTRACT

A semiconductor memory apparatus may include a memory cell array. The semiconductor memory apparatus may include an impedance calibration circuit configured to perform an impedance matching operation by generating an impedance code based on a voltage of an interface node determined by an external reference resistor or an internal reference resistor unit according to whether or not to the external reference resistor is coupled to the impedance calibration circuit. The semiconductor memory apparatus may include a data input/output (I/O) driver configured to receive input data from the memory cell array and generate output data in response to the impedance code.

20 Claims, 7 Drawing Sheets

US 9,478,267 B1

SEMICONDUCTOR MEMORY APPARATUS, AND IMPEDANCE CALIBRATION CIRCUIT AND METHOD THEREOF

CROSS-REFERENCES TO RELATED APPLICATION

This application claims priority under 35 U.S.C. 119(a) to Korean application No. 10-2015-0072694, filed on May 26, 2015, in the Korean intellectual property Office, which is incorporated by reference in its entirety as set forth in full.

BACKGROUND

1. Technical Field

Various embodiments generally relate to a semiconductor integrated circuit apparatus, and more particularly, to a semiconductor memory apparatus, and impedance calibration circuit and method thereof.

2. Related Art

Semiconductor memory apparatuses may include a receiving circuit configured to receive signals transmitted from external apparatuses. The semiconductor memory apparatuses may also include transmitting circuits configured to transmit signals from within the the semiconductor memory apparatuses to external apparatuses.

Swing widths of the signals received in the receiving circuit and transmitted from the transmitting circuit of the semiconductor memory apparatuses depend on processing rates of the semiconductor memory apparatuses. That is, as the processing rates of the semiconductor memory apparatuses are increased, the delay time required for signal transmission may be controlled and minimized through reduction in the swing widths.

However, when the swing widths of the signals are reduced, the effect on external noise may be increased, and impedance mismatching in interface stages of the semiconductor memory apparatuses may occur.

The impedance mismatching is caused from external noise, variation in the power voltage, change in the operation temperature, variation in the fabrication process, or the like.

The impedance mismatching may disturb high-speed data transmission, and as a result of the mismatching the output data of the semiconductor memory apparatuses may be distorted.

SUMMARY

According to an embodiment, there may be provided a semiconductor memory apparatus. The semiconductor memory apparatus may include a memory cell array. The semiconductor memory apparatus may include an impedance calibration circuit configured to perform an impedance matching operation by generating an impedance code based on a voltage of an interface node determined by an external reference resistor or an internal reference resistor unit according to whether or not to the external reference resistor is coupled to the impedance calibration circuit. The semiconductor memory apparatus may include a data input/output (I/O) driver configured to receive input data from the memory cell array and generate output data in response to the impedance code.

According to an embodiment, there may be provided an impedance calibration circuit. The impedance calibration circuit may include a monitoring unit coupled to an interface node and configured to determine a level of an internal resistor enable signal according to whether or not an external reference resistor is coupled to the impedance calibration circuit. The impedance calibration circuit may include an internal resistor unit configured to be driven in response to the internal resistor enable signal and apply a voltage to the interface node according to an internal reference resistance value of an internal reference resistor unit based on a trim code. The impedance calibration circuit may include a correction unit configured to generate an impedance code according to the voltage applied to the interface node by the internal resistor unit.

According to an embodiment, there may be provided an impedance calibration method of an impedance calibration circuit coupled to an interface node and including an internal reference resistor unit. The impedance calibration method may include determining whether or not an external reference resistor is coupled to the impedance calibration circuit. The impedance calibration method may include performing impedance matching based on a voltage of the interface node determined through the internal reference resistor unit when the external reference resistor is not coupled to the impedance calibration circuit.

DETAILED DESCRIPTION

Figure 1:
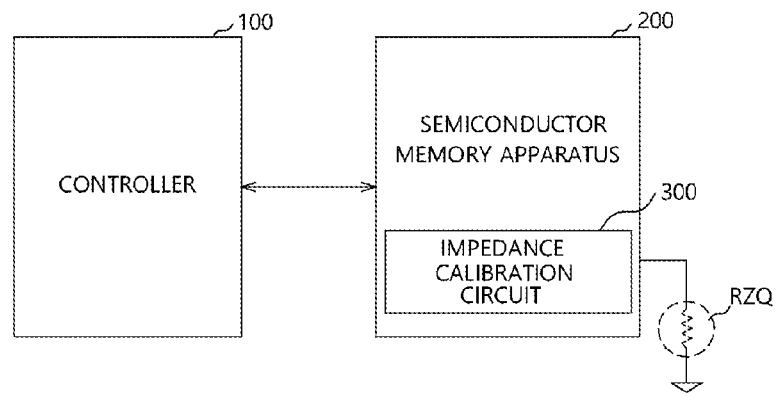
FIG. 1 is a configuration diagram illustrating a representation of an example of a semiconductor memory system according an embodiment.

Various examples of embodiments will be described below with reference to the accompanying drawings. Various examples of embodiments are described herein with reference to cross-sectional illustrations that are schematic illustrations of examples of the embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The embodiments are described herein with reference to cross-section and/or plan illustrations that are schematic illustrations of idealized embodiments. Although a few embodiments of the specification will be illustrated and described, it will be appreciated by those of ordinary skill in the art that changes may be made in these examples of embodiments without departing from the principles and spirit of the specification.

Due to the limitations discussed above related to impedance mismatching and high-speed data transmission, there is a need for controlling the driving degree of an input/output (I/O) driver to match between the semiconductor memory apparatuses and the external apparatuses.

FIG. 1 is a configuration diagram illustrating a representation of an example of a semiconductor memory system according to an embodiment.

Referring to FIG. 1, a semiconductor memory system 10 may include a controller 100 and a semiconductor memory apparatus 200.

The controller 100 may control the semiconductor memory apparatus 200 in response to a request of an external apparatus (for example, a host). The controller 100 may control the semiconductor memory apparatus 200 according to an internal request within the semiconductor memory apparatus 200 without a request from the external apparatus.

The semiconductor memory apparatus 200 may operate in accordance with control from the controller 100 and may operate as a storage medium. The storage medium may store information. The semiconductor memory apparatus 200 may include one or more memory chips, and may communicate with the controller 100 through one or more channels. Each of the memory chips may include a memory cell array, an access circuit configured to access the memory cell array, and a data input/output (I/O) driver configured to perform a data I/O operation with the memory cell array.

In an embodiment, the semiconductor memory apparatus 200 may include an impedance calibration circuit 300.

The impedance calibration circuit 300 may calibrate a resistance value of the data I/O driver included in the semiconductor memory apparatus 200 according to control from the controller 100 (i.e., control signals received from the controller 100).

In an example, when an external reference resistor RZQ is provided in an apparatus to which the semiconductor memory system 10 is applied, the impedance calibration circuit 300 may be electrically coupled to the external reference resistor RZQ and may perform an impedance matching operation. In an example, when the external reference resistor RZQ is not provided in the apparatus to which the semiconductor memory system 10 is applied, the impedance calibration circuit 300 may autonomously perform the impedance matching operation.

To autonomously perform the impedance matching operation, the impedance calibration circuit 300 may include an internal resistor unit. The impedance calibration circuit 300 may further include a monitoring unit. The monitoring unit may be enabled to perform the impedance matching operation through any one of the external reference resistor RZQ and an internal reference resistor by determining whether or not the external reference resistor RZQ is provided.

Figure 2:
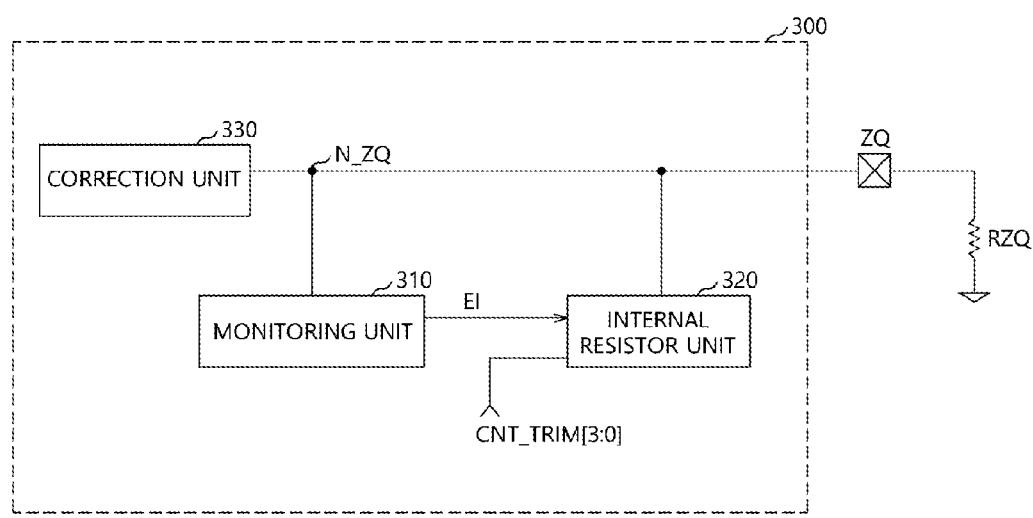
FIG. 2 is a configuration diagram illustrating a representation of an example of an impedance calibration circuit according to an embodiment.

Referring to FIG. 2, the impedance calibration circuit 300 may include a monitoring unit 310, an internal resistor unit 320, and a correction unit 330.

The monitoring unit 310 may be coupled to an interface node. The interface node may be coupled to an interface pad ZQ. For example, the interface pad ZQ may be coupled to a ZQ node N_ZQ and the monitoring unit 310 may determine whether or not the external reference resistor RZQ is coupled to the impedance calibration circuit 300. When the external reference resistor RZQ is coupled, the monitoring unit 310 may disable the internal resistor unit 320 by disabling an internal resistor enable signal EI. When the external reference resistor RZQ is not coupled, the monitoring unit 310 may enable the internal resistor unit 320 by enabling the internal resistor enable signal EI.

The internal resistor unit 320 may be driven in response to the internal resistor enable signal EI. The internal resistor unit 320 may apply a potential to the ZQ node N_ZQ according to an internal resistance value. The internal resistance value may be determined based on a trim code CNT_TRIM[3:0]. The trim code CNT_TRIM[3:0] may be including a plurality of bits and receiving from the controller 100.

The correction unit 330 may perform the impedance matching operation of the data I/O driver included in the semiconductor memory apparatus 200 according to the potential applied to the ZQ node N_ZQ.

The semiconductor memory apparatus 200 according to an embodiment may perform the impedance matching operation according to the potential of the ZQ node N_ZQ determined based on the external reference resistor RZQ when the external reference resistor RZQ is coupled to the impedance calibration circuit 300. When the external reference resistor RZQ is not coupled to the impedance calibration circuit 300, the semiconductor memory apparatus 200 may perform the impedance matching operation according to the potential of the ZQ node N_ZQ determined based on the resistance value determined in the internal resistor unit 320.

Figure 3:
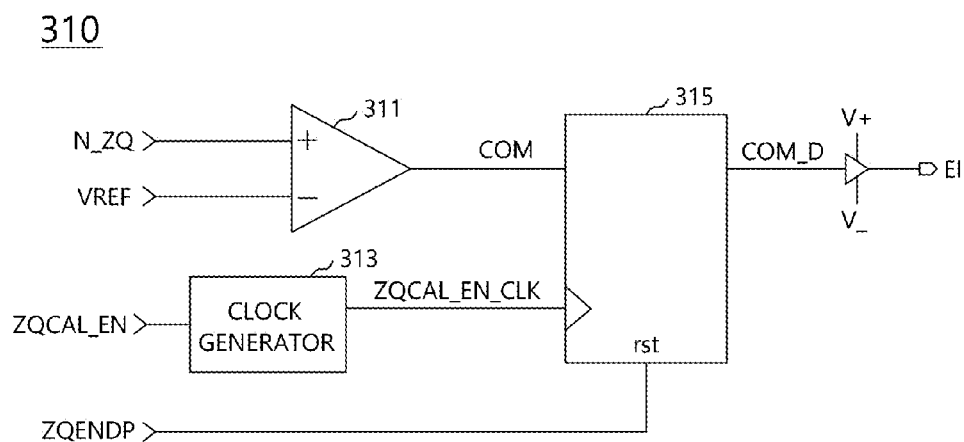
FIG. 3 is a configuration diagram illustrating a representation of an example of a monitoring unit according to an embodiment.

FIG. 3 is a configuration diagram illustrating a representation of an example of a monitoring unit according to an embodiment.

Referring to FIG. 3, the monitoring unit 310 may include a comparator 311, a clock generator 313, an output unit 315, and an amplifier 317.

The comparator 311 may output a comparison signal COM by comparing the potential of the ZQ node N_ZQ with a reference voltage VREF. The comparison signal COM may, for example, be output as a logic high level when the potential of the ZQ node N_ZQ is larger than the reference voltage VREF, but the embodiments are not limited in this way.

The clock generator 313 may generate an impedance calibration clock signal ZQCAL_EN_CLK by delaying an impedance calibration enable signal ZQCAL_EN for a preset time.

The output unit 315 may receive the comparison signal COM, and output a delayed comparison signal COM_D. The delayed comparison signal COM_D is the comparison signal COM delayed for a preset time in response to the impedance calibration clock signal ZQCAL_EN_CLK received by the output unit 315. The output unit 315 may be reset by a reset signal ZQENDP.

The amplifier 317 may generate the internal resistor enable signal EI by driving the delayed comparison signal COM_D. As illustrated the amplifier 317 is configured to receive a positive power supply V+ and a negative power supply V−.

Figure 4:
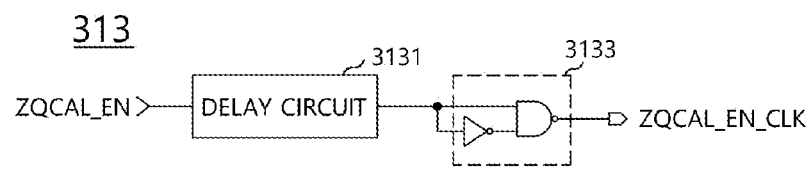
FIG. 4 is a configuration diagram illustrating a representation of an example of a clock generator according to an embodiment.

In an embodiment, the clock generator 313 may include a delay circuit 3131 and a pulse generator 3133 as illustrated in FIG. 4.

The delay circuit 3131 may delay the impedance calibration enable signal ZQCAL_EN for a preset time. The pulse generator 3133 may generate the impedance calibration clock signal ZQCAL_EN_CLK through a combination of an output signal and an inverted output signal of the delay circuit 3131.

Figure 5:
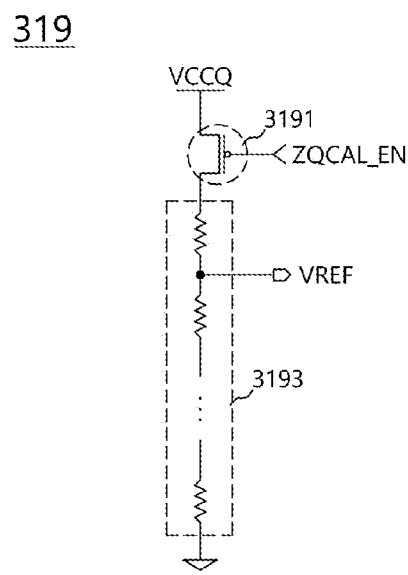
FIG. 5 is a configuration diagram illustrating a representation of an example of a reference voltage generator according to an embodiment.

In an embodiment, the reference voltage VREF may be generated through a reference voltage generator 319 as illustrated in FIG. 5.

Referring to FIG. 5, the reference voltage generator 319 may include a current source 3191 and a reference voltage output unit 3193.

The current source 3191 may receive a power voltage VCCQ and supply a current to the reference voltage output unit 3193 in response to the impedance calibration enable signal ZQCAL_EN.

The reference voltage output unit 3193 may be configured to include a resistor chain formed with a plurality of resistor elements coupled in series between the current source 3191 and a ground terminal. The reference voltage output unit 3193 may be designed, for example, to output the reference voltage VREF having a voltage level (¾ VCCQ) corresponding to three-fourths of the power voltage VCCQ. However, the reference voltage VREF is not limited thereto.

Figure 6:
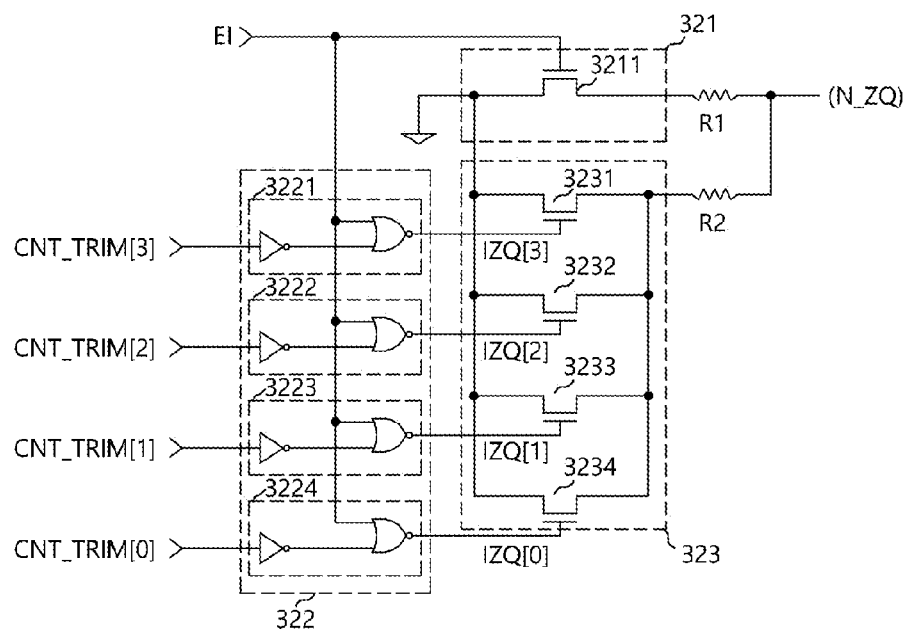
FIG. 6 is a configuration diagram illustrating a representation of an example of an internal resistor unit according to an embodiment.

The internal resistor unit 320 of FIG. 2, for example, may have a configuration as illustrated in FIG. 6.

Referring to FIG. 6, the internal resistor unit 320 may include a driver 321, a controller 322, and an internal reference resistor unit 323.

The driver 321 may determine the potential level of the ZQ node N_ZQ in response to the internal resistor enable signal EI. For example, the driver 321 may have a switching element 3211 connected between the ZQ node N_ZQ and a ground terminal, and may be driven by the internal resistor enable signal EI.

The controller 322 may control a resistance value of the internal reference resistor unit 323 based on the internal resistor enable signal EI and the trim code CNT_TRIM[3:0]. In an embodiment, the controller 322 may be configured to include first to fourth internal resistor control signal generators 3221, 3222, 3223, and 3224.

For example, each of the internal resistor control signal generators 3221 to 3224 constituting the controller 322 may generate an internal resistor control signal IZQ[3:0] based on a logic level of each trim code CNT_TRIM[3:0] when the internal resistor enable signal EI is enabled. In an embodiment, the internal resistor enable signal EI may be enabled to a logic low level when the external reference resistor RZQ is not provided. The internal resistor control signal generators 3221 to 3224 may be configured of logic elements (for example, NOR elements) for comparing logic levels of inverted signals of the trim codes CNT_TRIM[3] to CNT_TRIM[0] and the logic level of the internal resistor enable signal EI. However, the configurations of the internal resistor control signal generators 3221 to 3224 are not limited thereto.

The internal reference resistor unit 323 may determine the potential of the ZQ node N_ZQ in response to the internal resistor control signal IZQ[3:0]. In an embodiment, the internal reference resistor unit 323 may include switching elements 3231, 3232, 3233, and 3234 driven in response to the internal resistor control signals IZQ[3] to IZQ[0], and coupled between the ZQ node N_ZQ and a ground terminal.

Referring to FIG. 6, resistor element R1 may be coupled between the ZQ node N_ZQ and the driver 321. Referring again to FIG. 6, resistor element R2 may be coupled between the ZQ node N_ZQ and the internal reference resistor unit 323.

Figure 7:
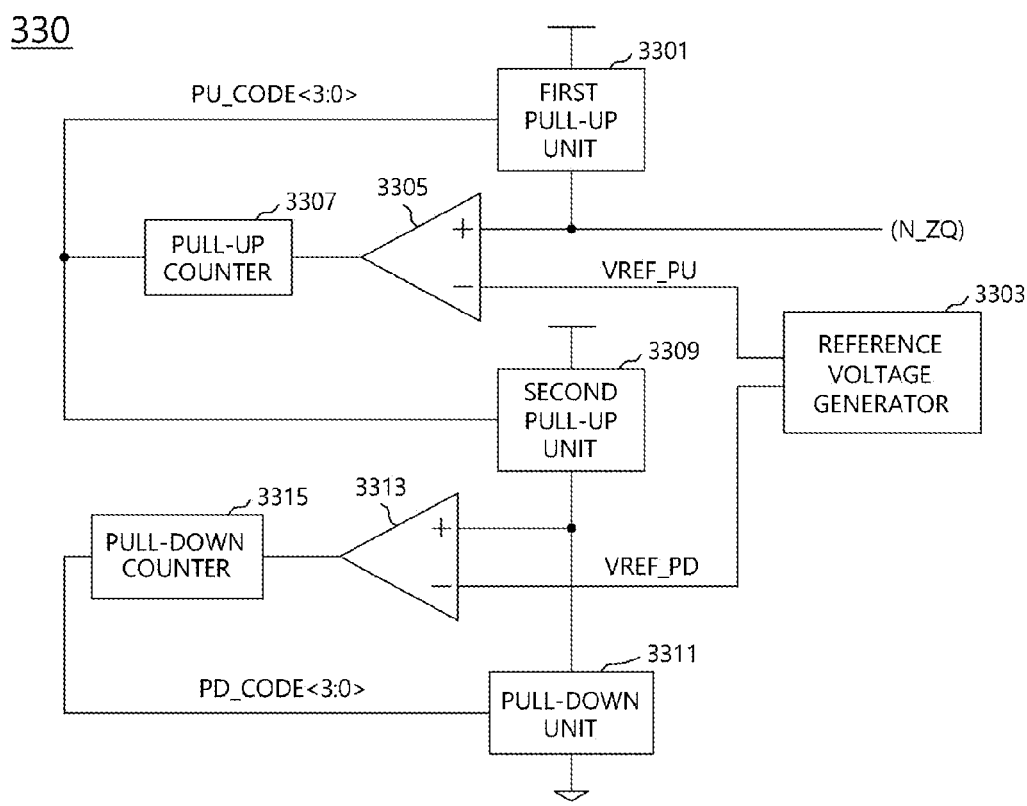
FIG. 7 is a configuration diagram illustrating a representation of an example of a correction unit according to an embodiment.

FIG. 7 is a configuration diagram illustrating a representation of an example of a correction unit according to an embodiment.

The correction unit 330 may be configured to include a first pull-up unit 3301, a reference voltage generator 3303, a first comparator 3305, and a pull-up counter 3307. The correction unit 330 may be configured to include a second pull-up unit 3309, a pull-down unit 3311, a second comparator 3313, and a pull-down counter 3315.

The first comparator 3305 may operate the pull-up counter 3307 by comparing a voltage of the ZQ node N_ZQ and a pull-up reference voltage VREF_UP provided from the reference voltage generator 3303.

The pull-up counter 3307 may generate a pull-up code PU_CODE<3:0> in response to an output signal of the first comparator 3305.

The first pull-up unit 3301 and the second pull-up unit 3309 may calibrate resistance values thereof to have the same value as the resistance value of the ZQ node N_ZQ in response to the pull-up code PU_CODE<3:0>.

For example, an impedance of the first pull-up unit 3301 may be calibrated by the pull-up code PU_CODE<3:0> output from the pull-up counter 3307. The calibrated impedance of the first pull-up unit 3301 may affect the ZQ node N_ZQ, and the pull-up impedance calibration operation may be repeatedly performed until the impedance of the first pull-up unit 3301 becomes equal to the impedance of the ZQ node N_ZQ. The pull-up code PU_CODE<3:0> output from the pull-up counter 3307 may also be provided to the second pull-up unit 3309, and a voltage of the second pull-up unit 3309 when the pull-up impedance calibration operation is completed may be referred to a pull-down impedance calibration operation.

The second comparator 3313 may operate the pull-down counter 3315 by comparing a voltage of the second pull-up unit 3309 with a pull-down reference voltage VREF_PD provided from the reference voltage generator 3303. The pull-down counter 3315 may generate the pull-down code PD_CODE<3:0> according to an output signal of the second comparator 3313.

The pull-down unit 3311 may calibrate a resistance value thereof to be equal to the impedance of the second pull-up unit 3309 in response to the pull-down code PD_CODE<3:0>.

The pull-up code PU_CODE<3:0> and the pull-down code PD_CODE<3:0> may be provided to the data I/O driver of the semiconductor memory apparatus 200 of FIG. 1 and used to calibrate the resistance value.

The configuration of the correction unit 330 illustrated in FIG. 7 is merely an example, and any circuit configuration configured for impedance matching through comparison of the voltage of the ZQ node N_ZQ with the reference voltage may be applied to the correction unit 330.

In an embodiment, the voltage of the ZQ node N_ZQ may be determined according to the external reference resistor RZQ when the external reference resistor RZQ is provided. The voltage of the ZQ node N_ZQ may be determined by the internal reference resistor unit 323 when the external reference resistor RZQ is not provided. In the embodiments, the impedance matching may be performed through the impedance calibration circuit when the external reference resistor RZQ is provided or not provided.

Figure 8:
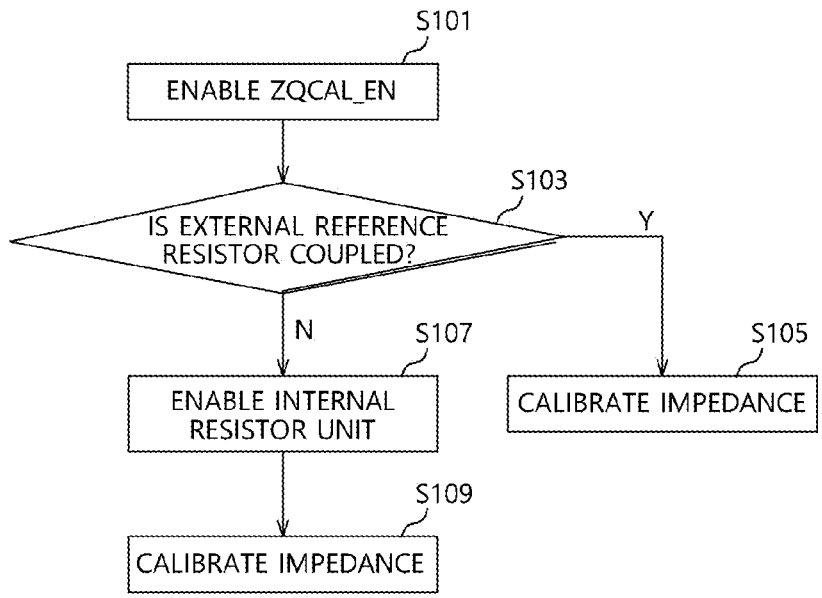
FIG. 8 is a flowchart illustrating a representation of an example of an impedance calibration method according to an embodiment.

FIG. 8 is a flowchart illustrating a representation of an example of an impedance calibration method according to an embodiment.

As the impedance calibration enable signal ZQCAL_EN provided from the controller 100 is enabled (S101), the monitoring unit 310 of the impedance calibration circuit 300 may determine whether or not the external reference resistor RZQ is coupled to the impedance calibration circuit 300 (S103).

When the external reference resistor RZQ is coupled to the impedance calibration circuit 300 (S103-Y), the impedance matching operation may be performed through the correction unit 330 based on the voltage applied to the ZQ node N_ZQ by the external reference resistor RZQ (S105).

When the external reference resistor RZQ is not coupled to the impedance calibration circuit 300 (S103-N), the internal resistor unit 320 may be enabled by the monitoring unit 310 of the impedance calibration circuit 300, and the internal reference resistance value of the internal reference resistor unit 323 may be determined based on the trim code CNT_TRIM[3:0] (S107). The correction unit 330 may perform the impedance matching operation according to the determined internal reference resistance value (S109).

Figure 9:
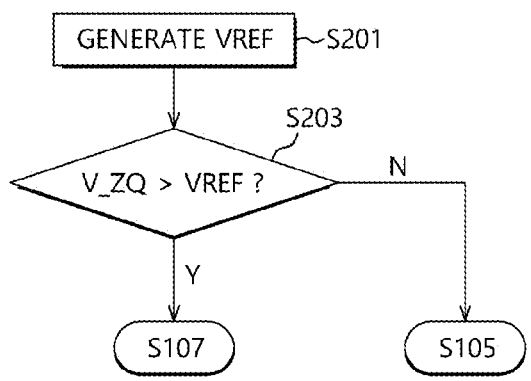
FIG. 9 is a flowchart illustrating a representation of an example of a method of determining whether or not an external reference resistor is coupled according to an embodiment.

The monitoring unit 310 may perform an operation as illustrated in FIG. 9 to determine whether or not the external reference resistor is coupled.

Referring to FIG. 9, the monitoring unit 310 may generate the reference voltage VREF (S201). For example, the reference voltage VREF may be generated to have a voltage level corresponding to three-fourths of the power voltage VCCQ, but the reference voltage VREF is not limited thereto.

The monitoring unit 310 may compare the voltage of the ZQ node N_ZQ with the reference voltage VREF (S203). When the voltage of the ZQ node N_ZQ is greater than the reference voltage VREF as a determination result (S203-Y), it may be determined that the external reference resistor RZQ is not coupled and proceed to operation S107. When the voltage of the ZQ node N_ZQ is equal to or less than the reference voltage VREF (S203-N), it may be determined that the external reference resistor RZQ is coupled and proceed to operation S105.

When the external reference voltage RZQ is provided or is not provided, the impedance matching operation may be performed, and performance of a data I/O operation may be suitably ensured.

Figure 10:
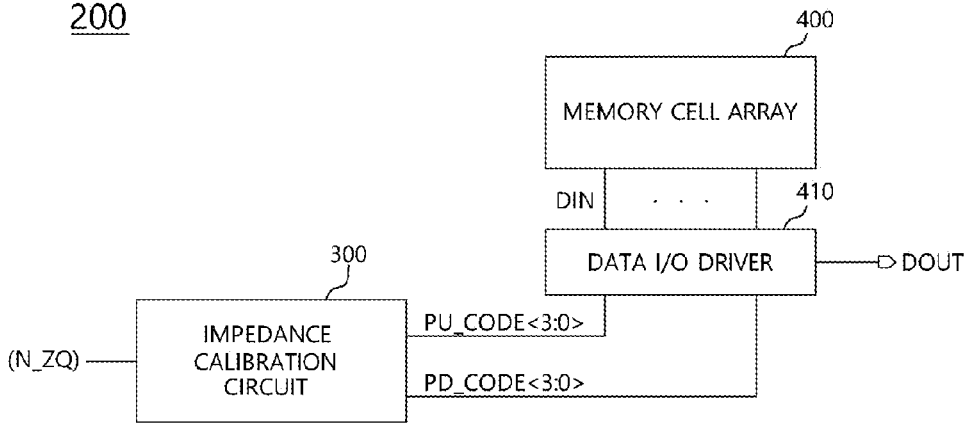
FIG. 10 is a configuration diagram illustrating a representation of an example of a semiconductor memory apparatus according to an embodiment.

FIG. 10 is a configuration diagram illustrating a representation of an example of a semiconductor memory apparatus according to an embodiment.

Referring to FIG. 10, the semiconductor memory apparatus 200 may include an impedance calibration circuit 300, a memory cell array 400, and a data I/O driver 410.

The impedance calibration circuit(s) 300 may have the same configurations as the configurations described with reference to FIGS. 2 to 7, and may implement the methods with regards to FIGS. 8 and 9. That is, the impedance calibration circuit(s) 300 may be configured to perform the impedance matching operation based on the voltage of the interface node N_ZQ determined by the external reference voltage RZQ or the internal reference resistor unit 323 according to whether or not the external reference resistor RZQ is coupled to the impedance calibration circuit 300.

The memory cell array 400 may be configured to include a plurality of memory cells. The memory cells may be arranged in a matrix form between a plurality of word lines and a plurality of bit lines.

The data I/O driver 410 may receive input data DIN from the memory cell array 400. The data I/O driver 410 may generate output data DOUT in response to impedance codes PU_CODE<3:0> and PD_CODE<3:0> provided from the impedance calibration circuit 300.

The impedance codes PU_CODE<3:0> and PD_CODE<3:0> may include a pull-up code PU_CODE<3:0> and a pull-down code PD_CODE<3:0>. The pull-up code PU_CODE<3:0> and the pull-down code PD_CODE<3:0> may be determined according to the voltage of the interface node N_ZQ determined by the external reference resistor RZQ or the internal reference resistor unit 323.

Figure 11:
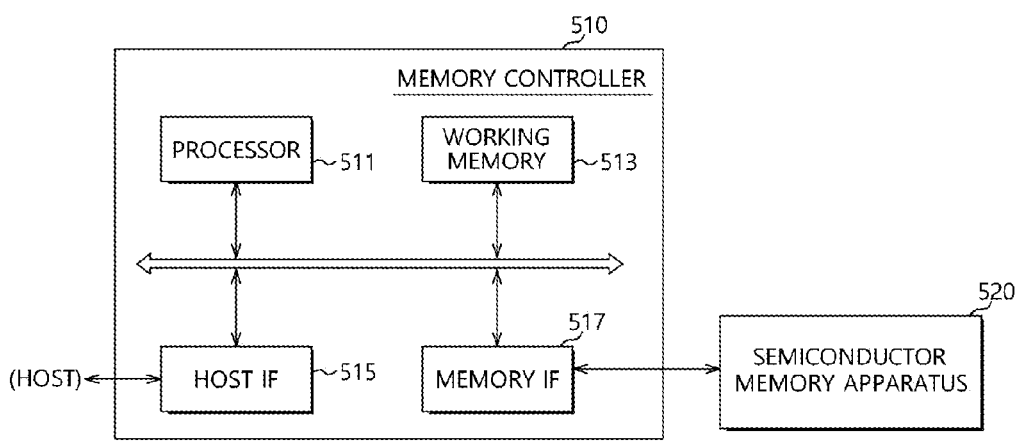
FIG. 11 is a configuration diagram illustrating a representation of an example of a data processing system according to an embodiment.

FIG. 11 is a configuration diagram illustrating a representation of an example of a data processing system according to an embodiment.

A data processing system 50 illustrated in FIG. 11 may include a memory controller 510 and a semiconductor memory apparatus 520.

The memory controller 510 may be configured to access the semiconductor memory apparatus 520 in response to a request of a host (HOST). The memory controller 510 may include a processor 511, a working memory 513, a host interface (HOST IF) 515, and a memory interface (MEMORY IF) 517.

The processor 511 may control an overall operation of the memory controller 510, and the working memory 513 may store an application, data, a control signal, and the like required for the operation of the memory controller 510.

The host interface 515 may perform protocol conversion for data/control signal exchange between the host and the memory controller 510, and the memory interface 517 may perform protocol conversion for data/control signal exchange between the memory controller 510 and the semiconductor memory apparatus 520.

The semiconductor memory apparatus 520 may include, for example, the impedance calibration circuit(s) 300 illustrated in FIGS. 2 to 7, 10, and may implement the methods with regards to FIGS. 8 and 9. The impedance calibration circuit(s) 300 in the semiconductor memory apparatus 520 may be configured to perform the impedance matching operations according to the voltage of the interface node N_ZQ determined by the external reference resistor RZQ or the internal reference resistor unit 323 according to whether or not the external reference resistor RZQ is coupled to the impedance calibration circuit 300.

The data processing system 50 illustrated in FIG. 11 may be used as a disc device. The data processing system 50 may be used as an internal/external memory card of a portable electronic apparatus or an image processor and other application chipsets.

The working memory 513 provided in the memory controller 510 may also be implemented using the semiconductor memory apparatuses illustrated in FIGS. 2 to 7, 10, and may implement the methods with regards to FIGS. 8 and 9.

Figure 12:
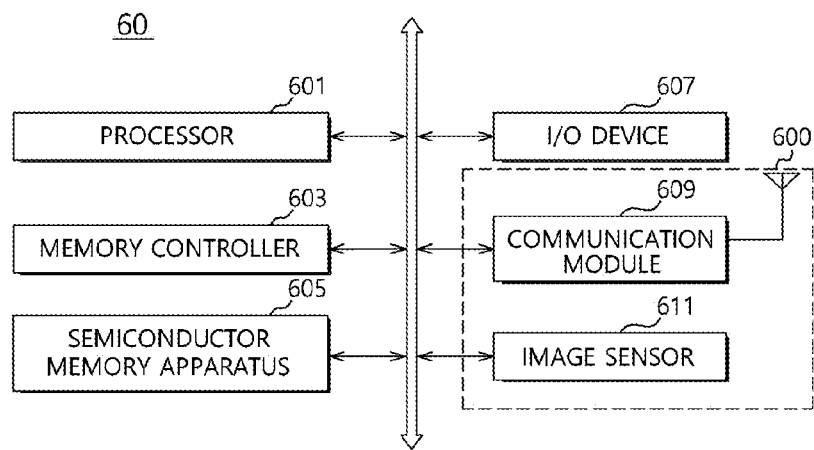
FIG. 12 illustrates representations of examples of configuration diagrams illustrating electronic systems according to the various embodiments.
Figure 13:
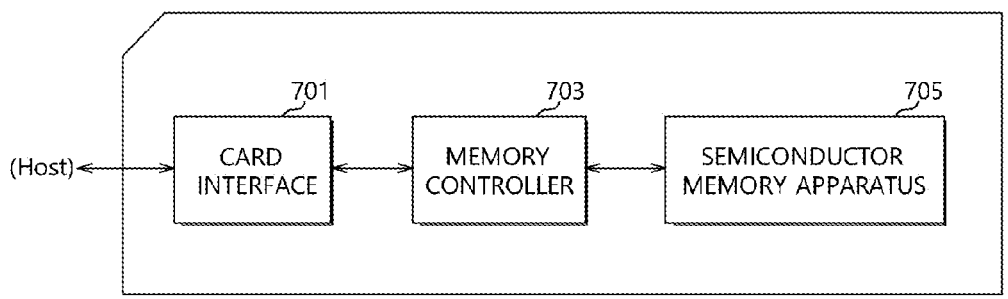
FIG. 13 illustrates representations of examples of configuration diagrams illustrating electronic apparatuses according to the various embodiments.

FIGS. 12 and 13 are configuration diagrams illustrating representations of examples of electronic systems according to the various embodiments.

An electronic system 60 illustrated in FIG. 12 may include a processor 601, a memory controller 603, a semiconductor memory apparatus 605, an I/O device 607, and a function module 600.

The memory controller 603 may control a data processing operation of the semiconductor memory apparatus 605, for example, a programming operation, a read operation, and the like according to control of the processor 601.

Data programmed in the semiconductor memory apparatus 605 may be output through the I/O device 607 according to control of the processor 601 and the memory controller 603. The I/O device 607 may include a display device, a speaker device, and the like.

The I/O device 607 may include an input device. The I/O device 607 may input a control signal for controlling an operation of the processor 601 or data to be processed by the processor 601 through the input device.

In an embodiment, the memory controller 603 may be implemented in a part of the processor 601 or in a chipset separately from the processor 601.

The semiconductor memory apparatus 605 may include, for example, the impedance calibration circuit(s) 300 illustrated in FIGS. 2 to 7, 10, and implement the methods with regards to FIGS. 8 and 9. The impedance calibration circuit(s) 300 in the semiconductor memory apparatus 605 may be configured to perform an impedance matching operation according to the voltage of the interface node N_ZQ determined by the external reference resistor RZQ or the internal reference resistor unit 323 according to whether or not the external reference resistor RZQ is coupled.

The function module 600 may be a module configured for performing a function selected according to an application example of the electronic system 60 illustrated in FIG. 12. FIG. 12 illustrates a communication module 609 and an image sensor 611 as an example of the function module 600.

The communication module 609 may provide a communication environment for exchanging data and a control signal through connection of the electronic system 60 to a wired or wireless communication network.

The image sensor 611 may convert an optical image to digital image signals and transmit the converted digital image signals to the processor 601 and the memory controller 603.

When the communication module 609 is included in the function module 600, the electronic system 60 illustrated in FIG. 12 may be a portable communication apparatus such as a wireless communication terminal. When the image sensor 611 is included in the function module 600, the electronic system 60 may be a digital camera, a digital camcorder, or an electronic system (for example, a personal computer (PC), a laptop PC, a mobile communication terminal, and the like) to which any one of the digital camera and the digital camcorder is attached.

An electronic apparatus 70 illustrated in FIG. 13 may include a card interface 701, a memory controller 703, and a semiconductor memory apparatus 705.

FIG. 13 is an illustrative diagram of, for example, a memory card or a smart card as the electronic apparatus 70. The electronic apparatus 70 may be any one of a PC card, a multimedia card, an embedded multimedia card, a secure digital card, and a universal serial bus (USB) drive, etc.

The card interface 701 may perform interfacing on data exchange between a host and the memory controller 703 according to a protocol of the host. In an embodiment, the card interface 701 may refer to hardware for supporting a protocol used by the host, software installed in the hardware for supporting the protocol used by the host, or a signal transmission scheme.

The memory controller 703 may control the data exchange between the semiconductor memory apparatus 705 and the card interface 701.

The semiconductor memory apparatus 705 may include, for example, the impedance calibration circuit(s) 300 illustrated in FIGS. 2 to 7, 10, and may implement the methods with regards to FIGS. 8 and 9. The impedance calibration circuit(s) 300 in the semiconductor memory apparatus 705 may be configured to perform an impedance matching operation according to the voltage of the interface node N_ZQ determined by the external reference resistor RZQ or the internal reference resistor unit 323 according to whether or not the external reference resistor RZQ is coupled to the impedance calibration circuit 300.

What is claimed is:

1. A semiconductor memory apparatus comprising:
   a memory cell array;
   an internal reference resistor unit configured to couple to the an interface node;
   an impedance calibration circuit configured to perform an impedance matching operation by generating an impedance code based on a voltage of the interface node determined by an external reference resistor or the internal reference resistor unit according to whether or not the external reference resistor is coupled to the impedance calibration circuit; and
   a data input/output (I/O) driver configured to receive input data from the memory cell array and generate output data in response to the impedance code.

2. The semiconductor memory apparatus of claim 1, wherein the impedance calibration circuit includes:
   a monitoring unit coupled to the interface node and configured to determine a level of an internal resistor enable signal according to whether or not the external reference resistor is coupled to the impedance calibration circuit;
   an internal resistor unit driven in response to the internal resistor enable signal and configured to apply a voltage to the interface node according to an internal reference resistance value of the internal reference resistor unit based on a trim code; and
   a correction unit configured to generate the impedance code according to the voltage applied to the interface node by the internal resistor unit.

3. The semiconductor memory apparatus of claim 1, wherein the impedance calibration circuit is configured to generate the internal resistor enable signal by comparing the voltage of the interface node with a reference voltage.

4. The semiconductor memory apparatus of claim 1, wherein the impedance calibration circuit is configured to determine the internal reference resistance value in response to the internal resistor enable signal generated according to comparison between the voltage of the interface node and a reference voltage, and determine the voltage of the interface node according to the internal reference resistance value.

5. The semiconductor memory apparatus of claim 4, further comprising:
a reference voltage generator configured to output the reference voltage having a voltage level less than a power voltage received by the reference voltage generator in response to an impedance calibration enable signal.

6. The semiconductor memory apparatus of claim 4, wherein the impedance calibration circuit includes:
an internal resistor control signal generator configured to generate an internal resistor control signal based on the internal resistor enable signal and a trim code; and
the internal reference resistor unit configured to determine the voltage of the interface node in response to the internal resistor control signal.

7. The semiconductor memory apparatus of claim 6, wherein the impedance calibration circuit includes:
a driver coupled between the interface node and the internal reference resistor unit and configured to determine a potential level of the interface node in response to the internal resistor enable signal.

8. An impedance calibration circuit comprising:
a monitoring unit coupled to an interface node and configured to determine a level of an internal resistor enable signal according to whether or not an external reference resistor is coupled to the impedance calibration circuit;
an internal resistor unit configured to be driven in response to the internal resistor enable signal and apply a voltage to the interface node according to an internal reference resistance value of an internal reference resistor unit based on a trim code; and
a correction unit configured to generate an impedance code according to the voltage applied to the interface node by the internal resistor unit.

9. The impedance calibration circuit of claim 8, wherein the monitoring unit is configured to generate the internal resistor enable signal by comparing the voltage of the interface node and a reference voltage.

10. The impedance calibration circuit of claim 9, further comprising:
a reference voltage generator configured to output the reference voltage having a voltage level less than a power voltage received by the reference voltage generator in response to an impedance calibration enable signal.

11. The impedance calibration circuit of claim 8, wherein the internal resistor unit is configured to determine the internal reference resistance value in response to the internal resistor enable signal generated through comparison between the voltage of the interface node and a reference voltage, and determine the voltage of the interface node according to the internal reference resistance value.

12. The impedance calibration circuit of claim 11, wherein the internal resistor unit includes:
an internal resistor control signal generator configured to generate an internal resistor control signal based on the internal resistor enable signal and the trim code; and
the internal reference resistor unit configured to determine the voltage of the interface node in response to the internal resistor control signal.

13. The impedance calibration circuit of claim 12, wherein the internal resistor unit includes:
a driver coupled between the interface node and the internal reference resistor unit and configured to determine a potential level of the interface node in response to the internal resistor enable signal.

14. An impedance calibration method of an impedance calibration circuit coupled to an interface node and including an internal reference resistor unit, the method comprising:
determining whether or not an external reference resistor is coupled to the impedance calibration circuit; and
performing impedance matching based on a voltage of the interface node determined through the internal reference resistor unit when the external reference resistor is not coupled to the impedance calibration circuit.

15. The method of claim 14, wherein the determining of whether or not the external reference resistor is coupled to the impedance calibration circuit includes comparing the voltage of the interface node with a reference voltage.

16. The method of claim 14, further comprising performing impedance matching based on the voltage of the interface node determined according to the external reference resistor when the external reference resistor is coupled to the impedance calibration circuit.

17. The method of claim 14, wherein the performing of the impedance matching further includes generating an impedance code.

18. The method of claim 17, wherein the impedance calibration circuit is coupled to a data input/output (I/O) driver,
the method further comprising providing the impedance code to the data I/O driver.

19. The method of claim 17, wherein the impedance calibration circuit is coupled to a controller,
the method further comprising calibrating a resistance value of the data I/O driver according to control from the controller.

20. The method of claim 14, wherein the impedance calibration circuit is coupled to a data input/output (I/O) driver,
the method further comprising performing an impedance matching operation of the data I/O driver according to the voltage of the interface node.

* * * * *